(12) United States Patent
Shum et al.

(10) Patent No.: US 7,611,941 B1
(45) Date of Patent: Nov. 3, 2009

(54) METHOD FOR MANUFACTURING A MEMORY CELL ARRANGEMENT

(75) Inventors: Danny Pak-Chum Shum, Poughkeepsie, NY (US); Robert Strenz, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/141,547

(22) Filed: Jun. 18, 2008

(51) Int. Cl.
*H01L 21/8238* (2006.01)

(52) U.S. Cl. ............... 438/201; 438/211; 257/E21.179; 257/E21.422

(58) Field of Classification Search .................. 438/201, 438/211, 257, 593; 257/E21.179, E21.422, 257/E21.68
See application file for complete search history.

(56) References Cited

U.S. PATENT DOCUMENTS

| 6,642,103 | B2 * | 11/2003 | Slotboom et al. ........... 438/257 |
| 2002/0100926 | A1 | 8/2002 | Kim et al. | |
| 2004/0014284 | A1 | 1/2004 | Kim et al. | |

OTHER PUBLICATIONS

Chen, H-Y, et al., "Novel 20nm Hybrid SOI/Bulk CMOS Technology with 0.183μm² 6T-STRAM Cell by Immersion Lithography," 2005 Symposium on VLSI Technology Digest of Technical Papers, 2005, pp. 16-17.
Mih, R., et al., "0.18um Modular Triple Self-Aligned Embedded Split-Gate Flash Memory," 2000 Symposium on VLSI Technology Digest of Technical Papers, 2000, pp. 120-121.

* cited by examiner

*Primary Examiner*—Hoai v Pham
(74) *Attorney, Agent, or Firm*—Slater & Matsil, L.L.P.

(57) ABSTRACT

In an embodiment of the invention, a method for manufacturing a memory cell arrangement includes forming a charge storing memory cell layer stack over a substrate; forming first and second select structures over, respectively, first and second sidewalls of the charge storing memory cell layer stack, wherein the first and second select structures in each case comprise a select gate configured as a spacer and laterally disposed from the respective sidewall of the charge storing memory cell layer stack; and removing a portion of the charge storing memory cell layer stack between the first and second select structures after formation of the first and second select structures, thereby forming first and second charge storing memory cell structures.

25 Claims, 11 Drawing Sheets

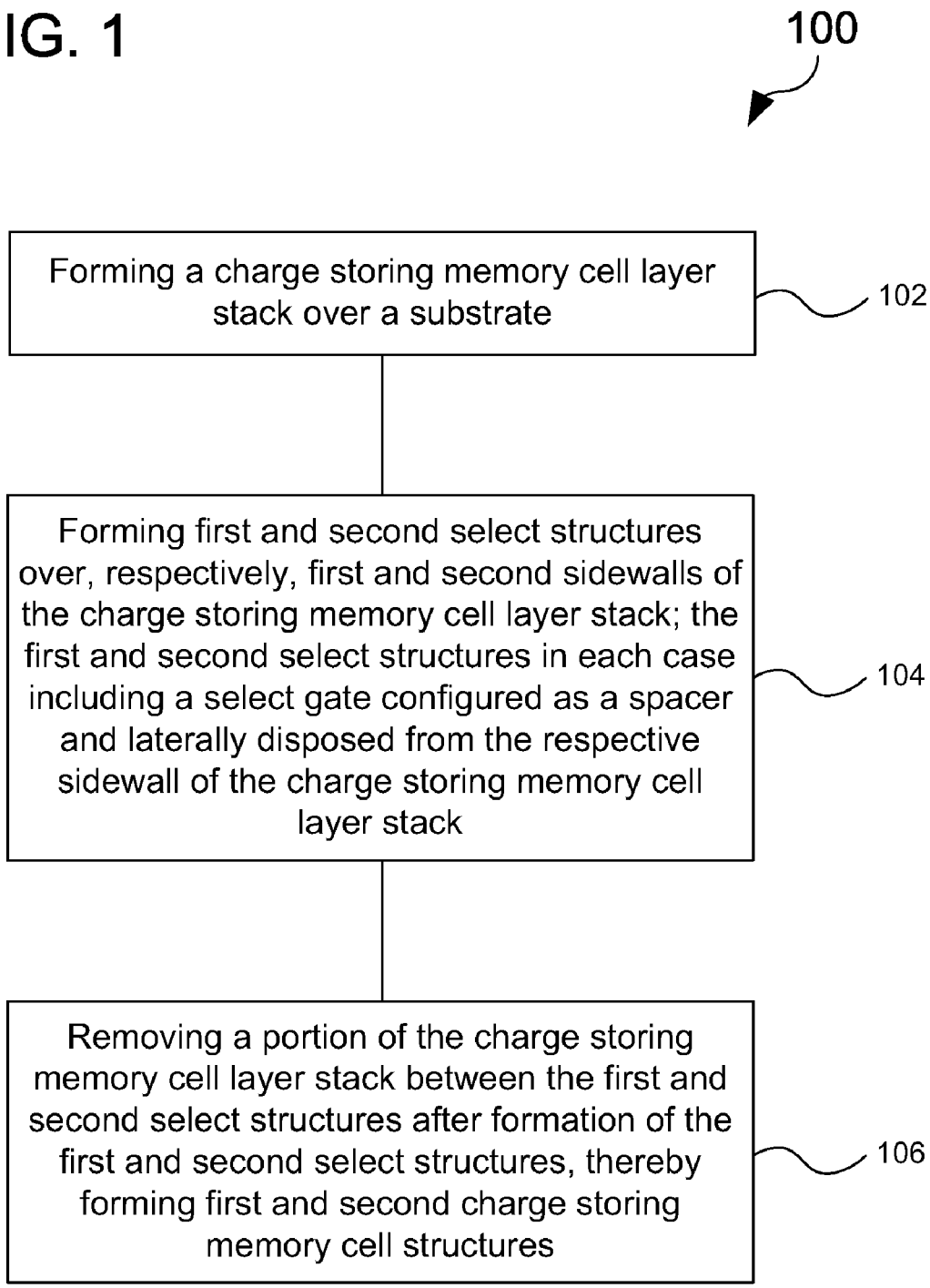

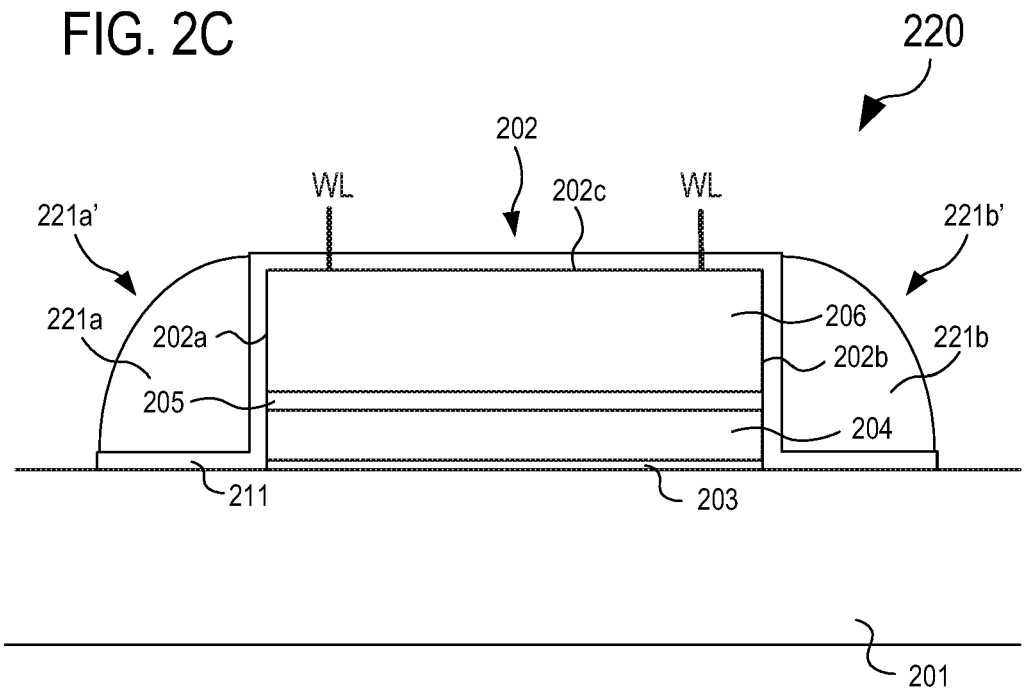
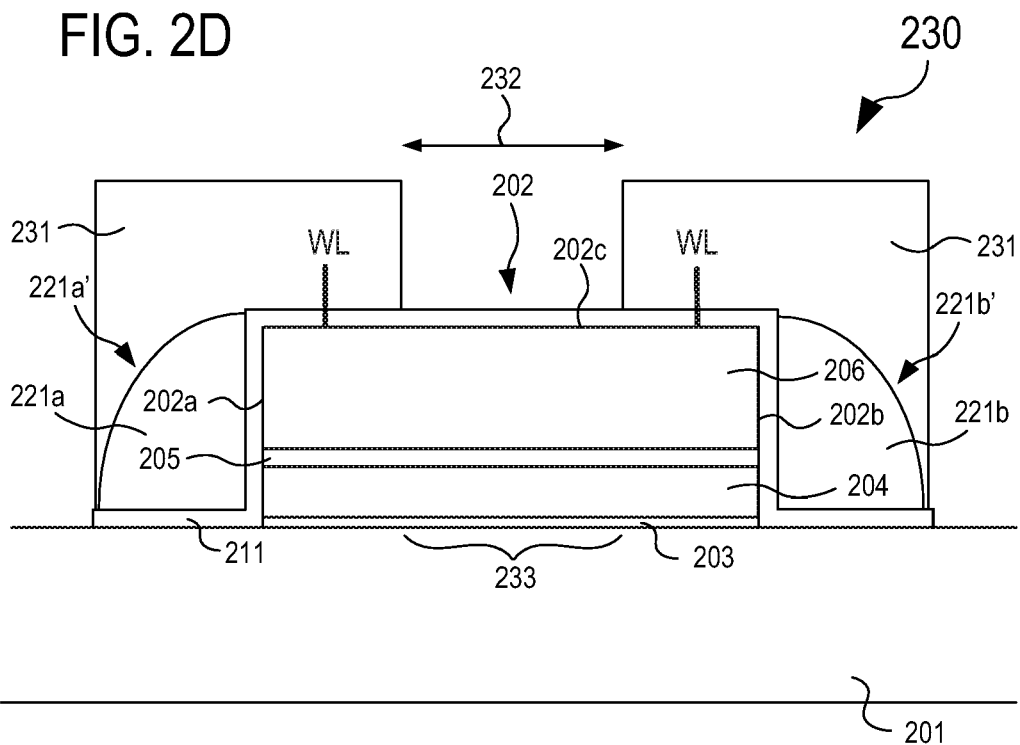

METHOD FOR MANUFACTURING A MEMORY CELL ARRANGEMENT

TECHNICAL FIELD

Embodiments relate generally to semiconductor devices, and in particular to memory cells such as, for example, flash memory cells.

BACKGROUND

One type of flash memory cell is the so-called triple poly (3Poly) sidewall spacer split-gate flash memory cell. FIG. 5 shows a schematic cross-sectional view of a 3Poly sidewall spacer split-gate flash memory cell 500. The memory cell 500 includes a gate stack 523 including a floating gate (FG) 502 and a logic or control gate (CG) 503 arranged above the floating gate 502, and a select gate (SG) 504 that is configured as a sidewall spacer and laterally disposed from a sidewall of the gate stack 523. The gate stack 523 and the select gate 504 are arranged above a substrate 501, and the gates 502, 503, 504 may be electrically insulated from one another and from the substrate 501 by one or more electrically insulating layers, e.g. oxide layers (not shown). The gate stack 523 and the select gate 504 are arranged over a channel region 505, which is formed between a source region 506 and a drain region 507 in the substrate 501. The gates 502, 503 and 504 of the memory cell 500 are in each case made of polysilicon.

The polysilicon used for the floating gate (FG) may sometimes be referred to as Poly1, and the polysilicon used for the logic/control gate (CG) may sometimes be referred to as Poly2. The logic/control gate may sometimes be referred to as PC.

A conventional 3Poly sidewall spacer cell using Poly1 (for FG) and Poly2 (for PC) may include the use of two lithography masks. Furthermore, an additional Poly3 module may be used to form the spacer select gate (SG). This Poly3 module may include polysilicon deposition, use of a poly spacer (PS) lithography mask (1+ generation litho ahead), and a reactive ion etch (RIE) process for the spacer formation, wherein the RIE process may be highly selective to oxide in order to avoid poly stringers.

For example, a process for manufacturing the flash memory cell 500 shown in FIG. 5 may include forming the gate stack 523 (including the polysilicon floating and control gates 502, 503) over the substrate 501 and carry out a liner oxidation first. Then, a polysilicon deposition followed by a reactive ion etch (RIE) may be carried out to form gate spacers on both sides (i.e., the source side and the drain side) of the gate stack 523. Then, using the poly spacer (PS) mask to block the drain side spacer while exposing the source side spacer, a reactive ion etch (RIE) process may be carried out to remove the source side spacer.

It may be a difficult task to completely remove the source side spacer from the gate stack 523 by the RIE process due to the structure, which is far from ideally planar and homogenous. In particular, polysilicon near the gate edge along the active-STI fence (in other words, along a boundary between an active region and an STI region) may be hard to remove completely. As a consequence, thin polysilicon residues (also referred to as polysilicon stringers) may be left after the etch process, which may form an undesirable electrical connection between the gate stack and a source side contact formed at a later stage. In order to prevent possible electrically shorted adjacent cells along the bitline caused by polysilicon stringers, the source side spacer should be removed completely during the etch process. In addition, an advanced technology lithography mask (for example, a next-generation (1+ generation) lithography mask, in other words a mask of one lithography generation ahead) may be applied as the PS mask which may require a tight CD (critical dimension) overlay of ½ (one half) of the gate length mask features to be printed on the wafer (for example, the typical gate length may be 1 F, where F is the minimum feature size in a respective generation node). A CD of ½ F may cause alignment issues that may require a next-generation lithography mask. The use of such a next-generation lithography mask may lead to an increase in the processing costs of the memory cell. Furthermore, in order to achieve a perfect removal of the source side spacer, the PS mask may need very exact alignment. That is, a slight misalignment of the PS mask may already lead to an incomplete removal of the spacer and should thus be avoided. In addition to the use of a next-generation lithography PS mask, a RIE process that is highly selective to oxide material of the insulating layers in the gate stack may be applied to achieve a perfect removal of the source side spacer and thus avoid poly stringers.

The formation of the polysilicon sidewall spacer select gate in accordance with the process described above may thus need the development of a new process module (Poly3 module).

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for manufacturing a memory cell arrangement in accordance with an embodiment;

FIGS. 2A to 2H show different views for illustrating a method for manufacturing a memory cell arrangement in accordance with an embodiment;

DETAILED DESCRIPTION OF ILLUSTRATIVE EMBODIMENTS

Figure 2A:
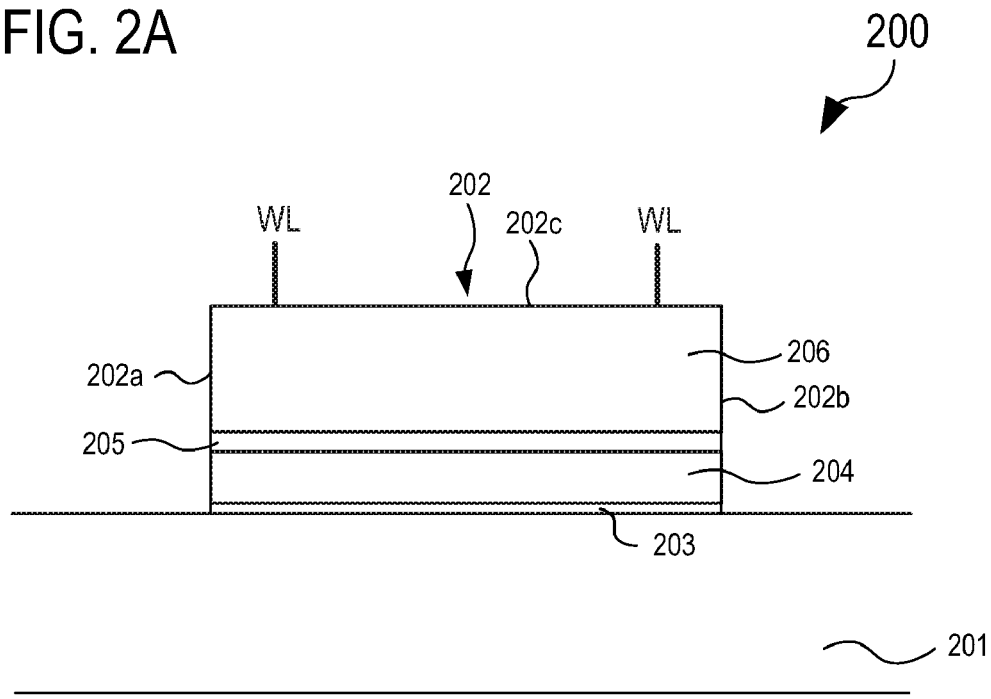

FIG. 1 shows a method 100 for manufacturing a memory cell arrangement in accordance with an embodiment.

In 102, a charge storing memory cell layer stack is formed over a substrate. In this application, the term "formed over" may include both the case that a first layer (or structure) is formed on a second layer (or structure), with direct physical contact to the second layer (or structure) below, and the case that the first layer is formed above the second layer, with one or more intervening layers (or structures) formed between the first and second layers.

In 104, first and second select structures are formed over, respectively, first and second sidewalls of the charge storing memory cell layer stack, wherein the first and second select structures in each case include a select gate configured as a spacer and laterally disposed from the respective sidewall of the charge storing memory cell layer stack.

In 106, a portion of the charge storing memory cell layer stack between the first and second select structures is removed after formation of the first and second select structures, thereby forming first and second charge storing memory cell structures.

In accordance with an embodiment, forming the charge storing memory cell layer stack may include forming a first electrically insulating layer over the substrate, forming a charge storing layer over the first electrically insulating layer, forming a second insulating layer over the charge storing layer, and forming a control gate layer over the second insulating layer.

In accordance with one embodiment, the charge storing layer may be configured as a floating gate layer, e.g., as a polysilicon floating gate layer in accordance with an embodiment. In accordance with an alternative embodiment, the charge storing layer may be configured as a charge trapping layer, e.g. as a nitride layer which may be part of an oxide-nitride-oxide (ONO) layer stack in accordance with an embodiment, or as a nanocrystalline layer in accordance with another embodiment.

In accordance with another embodiment, forming the first and second select structures may include forming an electrically conductive layer over the first and second sidewalls of the charge storing memory cell layer stack and over a top surface of the charge storing memory cell layer stack, and removing a portion of the electrically conductive layer from above the charge storing memory cell layer stack such that the select gates of the first and second select structures are formed.

In accordance with an embodiment, forming the electrically conductive layer over the first and second sidewalls and over the top surface of the charge storing memory cell layer stack may include or may be achieved by means of a deposition process, e.g., a conformal deposition process in accordance with one embodiment.

In accordance with an embodiment, forming the electrically conductive layer includes depositing a polysilicon layer over the first and second sidewalls and over the top surface of the charge storing memory cell layer stack.

In accordance with another embodiment, removing the portion of the electrically conductive layer from above the charge storing memory cell layer stack may include or may be achieved by means of anisotropically etching the electrically conductive layer.

In accordance with one embodiment, the anisotropic etching of the electrically conductive layer may include or may be achieved by means of a reactive ion etch (RIE) process. In accordance with an alternative embodiment, any other suitable anisotropic etch process may be used.

In accordance with another embodiment, dopant atoms may be implanted into the substrate after formation of the first and second select structures and before removing the portion of the charge storing memory cell layer stack, thereby forming first and second drain junctions of the memory cell arrangement in the substrate.

In accordance with another embodiment, dopant atoms may be implanted into the substrate after formation of the first and second select structures and after removing the portion of the charge storing memory cell layer stack, thereby forming a source junction and first and second drain junctions of the memory cell arrangement in the substrate. In accordance with an alternative embodiment, a drain junction and first and second source junctions may be formed by means of the implantation.

In accordance with another embodiment, removing the portion of the charge storing memory cell layer stack may include forming a mask layer over the charge storing memory cell layer stack and the first and second select structures, wherein the mask layer may be structured such that it has an opening above the portion of the charge storing memory cell layer stack between the first and second select structures, and anisotropically etching the portion of the charge storing memory cell layer stack.

In accordance with another embodiment, the mask layer may be configured as a cut mask (e.g. as a block level cut mask). In this context, the term "cut mask" may include masks that are derived from technologies developed for conventional photolithography with reactive ion etch (RIE) to enhance the feature density without using next-generation lithography tools. In accordance with an embodiment, the term "cut mask" may, for example, include a mask that is derived from the so-called $DE^2$ (Double Exposure/Double Etch) technology. The $DE^2$ approach has, for example, been used in the fabrication of SRAM (static random access memory) cells and uses a first mask (termed PC mask) for gate patterning and a second mask (termed CT mask) to cut PC lines to produce SRAM line ends. The second mask, which is used in the context of a second exposure and second RIE process, makes it possible to reduce the final tip-to-tip distance of gate conductor line ends in the SRAM cells and avoid tip-to-tip line end bridging without using a higher NA (numerical aperture) lithography tool. The term "cut mask" as used herein, may include a mask that is similar to the second mask of the above-described $DE^2$ approach and that may, for example, be used for patterning large poly and RIE to create two separate poly cells. The term "block level" may include optical lithography tools that use the i-line (i.e., the spectral line at 365 nm wavelength), and that may be used predominantly in non-critical dimension lithography, e.g., in the context of implant level control or patterned wet etch processes.

In accordance with an embodiment, the anisotropic etching of the portion of the charge storing memory cell layer stack may include or may be achieved by means of a reactive ion etch (RIE) process. In accordance with an alternative embodiment, any other suitable anisotropic etch process may be used.

In accordance with an embodiment, the charge storing memory cell layer stack may include an electrically insulating layer arranged on the substrate, wherein the anisotropic etching of the portion of the charge storing memory cell layer stack may be carried out in such a manner that the etching stops on the electrically insulating layer of the charge storing memory cell layer stack.

In accordance with another embodiment, dopant atoms may be implanted into the substrate between the first and second charge storing memory cell structures after removing the portion of the charge storing memory cell layer stack, thereby forming a source junction of the memory cell arrangement, or a drain junction in accordance with an alternative embodiment.

In accordance with another embodiment, an electrically insulating layer may be formed at least on the first and second sidewalls of the charge storing memory cell layer stack before forming the first and second select structures, wherein the select gates of the first and second select structures may be formed on the electrically insulating layer.

In accordance with another embodiment, an oxide layer may be formed over sidewalls of the first and second charge storing memory cell structures that are distant from the select structures, after removing the portion of the charge storing memory cell layer stack, and an electrically conductive layer may be formed on the oxide layer and between the first and second charge storing memory cell structures.

In accordance with an embodiment, forming the oxide layer over the sidewalls of the charge storing memory cell structures may include depositing an oxide layer over the first and second select structures, and over and between the first and second charge storing memory cell structures, and removing the oxide layer from above the first and second select structures and the first and second charge storing memory cell structures.

In accordance with an embodiment, depositing the oxide layer may include or may be achieved by means of an ozone-activated TEOS deposition process.

In accordance with another embodiment, removing the portion of the oxide layer may include or may be achieved by anisotropically etching the oxide layer.

In accordance with one embodiment, the anisotropic etching of the oxide layer may include or may be achieved by means of a reactive ion etch (RIE) process. In accordance with an alternative embodiment, any other suitable anisotropic etch process may be used.

In accordance with an embodiment, forming the electrically conductive layer over the oxide layer between the first and second charge storing memory cell structures may include depositing an electrically conductive material over the first and second select structures, and over and between the first and second charge storing memory cell structures, and removing the electrically conductive material from above the first and second select structures and the first and second charge storing memory cell structures.

In accordance with another embodiment, the electrically conductive layer may include or may be made of polysilicon.

In accordance with an embodiment, the substrate may be configured as a semiconductor substrate or wafer, for example as a silicon substrate or wafer, e.g. as a silicon bulk substrate or wafer.

In accordance with an embodiment, the substrate may be doped with doping atoms of a first conductivity type (e.g., a p-type conductivity type) or may include a well region that may be doped with doping atoms of the first conductivity type, wherein the charge storing memory cell layer stack may be formed over the well region. In accordance with another embodiment, the well region may be arranged within another well region that is arranged within the substrate and that may be doped with doping atoms of a second conductivity type (e.g., an n-type conductivity type). In other words, in accordance with an embodiment the memory cell arrangement may have a triple-well structure. In accordance with alternative embodiments, the memory cell arrangement may have a multiple-well structure including multiple wells with alternate conductivity type and arranged within one another.

In the following, a method for manufacturing a memory cell arrangement in accordance with an embodiment will be described in connection with FIGS. 2A to 2H.

FIG. 2A shows in a view 200 that a charge storing memory cell layer stack 202 is formed on a substrate 201. In accordance with an embodiment, the substrate 201 may be a silicon substrate. The charge storing memory cell layer stack 202 has first and second sidewalls 202a, 202b on opposite sides of the stack 202, wherein the first sidewall 202a and the second sidewall 202b may be perpendicular or approximately perpendicular to the substrate surface or main processing surface. Furthermore, the charge storing memory cell layer stack 202 has a top surface 202c that may be parallel or approximately parallel to the substrate surface or main processing surface.

In accordance with an embodiment, the substrate 201 may include a p-doped well region (P-well), wherein the charge storing storing memory cell layer stack 202 may be formed on the well region. In accordance with an embodiment, the well region may be configured as a high-voltage P-well.

The charge storing memory cell layer stack 202 includes a first electrically insulating layer 203 formed on the substrate 201, a charge storing layer 204 formed on the first electrically insulating layer 203, a second electrically insulating layer 205 formed on the charge storing layer 204, and an electrically conductive layer 206 formed on the second electrically insulating layer 205.

In accordance with an embodiment, the first electrically insulating layer 203 may be an oxide layer, and may for example be configured as a tunnel oxide that may allow tunneling (e.g. Fowler-Nordheim (FN) tunneling) of electric charge carriers (e.g., electrons) into and/or out of the charge storing layer 204 through the tunnel oxide. In case that the charge storing layer 204 is configured as a floating gate layer, the first electrically insulating layer 203 may also be referred to as a gate dielectric layer.

In accordance with an embodiment, the charge storing layer 204 may be configured as a floating gate layer. In this case, the charge storing layer 204 may include or may be made of an electrically conductive material such as, for example, polysilicon. In accordance with other embodiments though, the charge storing layer 204 may include or may be made of other electrically conductive materials.

In accordance with another embodiment, the charge storing layer 204 may be configured as a charge trapping layer. In this case, the charge trapping layer may, for example, be configured as a nitride layer which may be part of an oxide-nitride-oxide (ONO) layer stack, in accordance with an embodiment.

In accordance with another embodiment, the electrically conductive layer 206 may be configured as a control (or logic) gate layer, and may be connected to one or more wordlines (WL), as shown. In accordance with an embodiment, the electrically conductive layer 206 may include or may be made of an electrically conductive material such as, for example, polysilicon. In accordance with other embodiments though, the electrically conductive layer 206 may include or may be made of other electrically conductive materials.

In accordance with an embodiment, the charge storing memory cell layer stack 202 may be formed by forming an electrically insulating layer (e.g., an oxide layer) on the substrate 201. The electrically insulating layer may be formed in a known manner, e.g., by oxidation of the substrate surface such that an oxide layer is formed on the substrate 201. An electrically conductive layer (for example, a polysilicon layer) may be formed on the electrically insulating layer in a known manner, e.g., by means of a deposition process (e.g., Poly1 deposition). The electrically insulating layer may serve as a tunnel dielectric (e.g., tunnel oxide), and the electrically conductive layer may serve as a floating gate (FG) layer of the memory cell arrangement. In an alternative embodiment, a charge trapping layer (e.g., a nitride layer as part of an ONO layer stack) may be formed on the electrically insulating layer instead of the electrically conductive layer.

The electrically insulating layer and the electrically conductive layer formed thereon may then be structured (e.g., by means of a lithographical process and an etch process, e.g., an anisotropic etch process such as, for example, a reactive ion etch (RIE) process) to form the first electrically insulating layer 203 (e.g., the tunnel oxide) and the charge storing layer 204 (e.g., the floating gate layer) of the charge storing memory cell layer stack 202. An electrically insulating layer (e.g., an oxide layer) may then be formed on the charge storing layer 204. The electrically insulating layer may be formed in a known manner. An electrically conductive layer (for example, a polysilicon layer) may subsequently be formed on the electrically insulating layer. In accordance with an embodiment, the electrically conductive layer may be formed in a known manner, e.g., by means of a deposition process (e.g., Poly2 deposition). The electrically conductive layer may serve to form a control gate layer (also referred to as logic gate layer) of the memory cell arrangement.

The layer stack defined by the first electrically insulating layer 203, the charge storing layer 204, the electrically insulating layer formed on the charge storing layer 204, and the electrically conductive layer formed on the electrically insulating layer may then be etched to form the charge storing memory cell layer stack 202 with the first electrically insulating layer 203, the charge storing layer 204, the second electrically insulating layer 205 and the electrically conductive layer 206, and with first and second sidewalls 202a, 202b on opposite sides of the charge storing memory cell layer stack 202. In accordance with one embodiment, an isotropic etch process such as, for example, a reactive ion etch (RIE) process may be used for the etching. Clearly, in accordance with one embodiment, a sidewall stack RIE process may be carried out to form the charge storing memory cell layer stack 202.

Figure 2B:
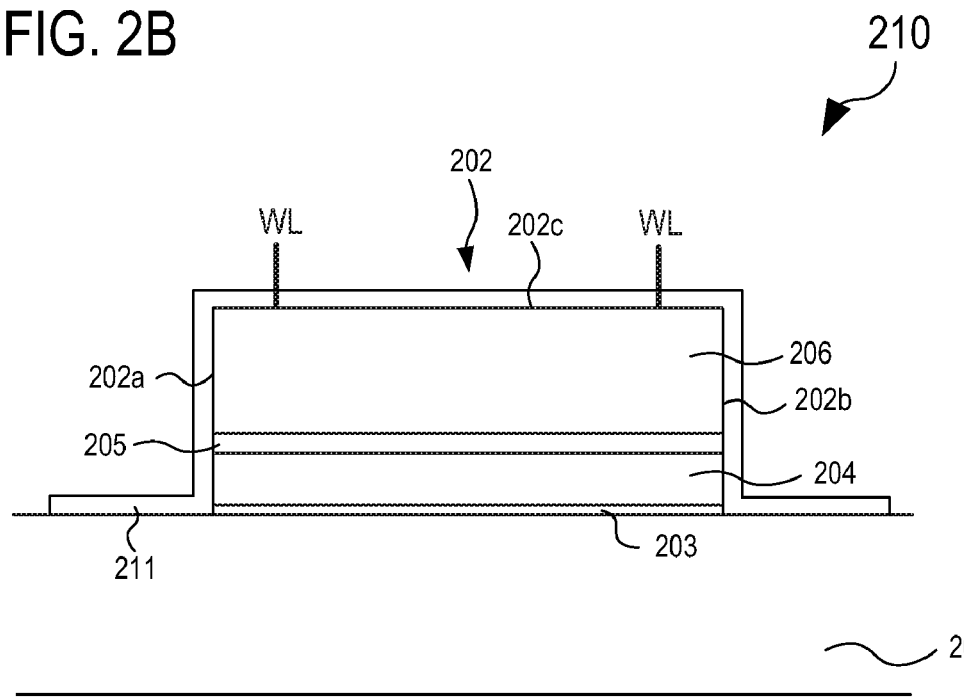

FIG. 2B shows in a view 210 that an electrically insulating layer 211 is formed on the sidewalls 202a, 202b and on the top surface 202c of the charge storing memory cell layer stack 202, and also on portions of the substrate 201 surface adjacent to the charge storing memory cell layer stack 202. In accordance with an embodiment, the electrically insulating layer 211 may be an oxide layer. In this case, the oxide layer may, for example, be formed by a thermal oxidation process and may, for example, have a thickness in the range from about 2 nm to about 50 nm in accordance with some embodiments, for example about 6 nm in one embodiment. The electrically insulating layer 211 (e.g., the oxide layer) may serve to electrically insulate select structures (select gates) to be formed later (cf. FIG. 2C), from the charge storing memory cell layer stack 202 and from the substrate 201. An electrically insulating layer 211 configured as an oxide layer may thus also be referred to as select gate (SG) oxide layer.

In accordance with another embodiment, one or more shallow trench isolation (STI) regions may be formed in the substrate 201 (not shown) before forming the charge storing memory cell layer stack 202 to laterally isolate the memory cell arrangement from other memory cell arrangements that may additionally be formed in and/or on the substrate 201.

FIG. 2C shows in a view 220 that first and second select structures 221a', 221b' are formed over, respectively, the first and second sidewalls 202a, 202b of the charge storing memory cell layer stack 202. In other words, a first select structure 221a' is formed over the first sidewall 202a of the charge storing memory cell layer stack 202, and a second select structure 221b' is formed over the second sidewall 202b of the charge storing memory cell layer stack 202. The first and second select structures 221a', 221b' in each case include a select gate 221a, 221b that is configured as a spacer and laterally disposed from the respective sidewall 202a, 202b of the charge storing memory cell layer stack 202. In other words, the first select structure 221a' includes a first select gate 221a configured as a spacer and laterally disposed from the first sidewall 202a of the charge storing memory cell layer stack 202, and the second select structure 221b' includes a second select gate 221b configured as a spacer and laterally disposed from the second sidewall 202b of the charge storing memory cell layer stack 202. As shown in FIG. 2C, the select gates 221a, 221b may be electrically insulated from the charge storing memory cell layer stack 202 and from the substrate 201 by means of the electrically insulating layer 211, in accordance with an embodiment.

In accordance with an embodiment, forming the first and second select structures 221a', 221b' may include forming an electrically conductive layer over the sidewalls 202a, 202b and over the top surface 202c of the charge storing memory cell layer stack 202, for example by means of a deposition process (e.g., a conformal deposition process in accordance with one embodiment), and removing a portion of the electrically conductive layer from above the charge storing memory cell layer stack 202, for example by means of an anisotropic etch process, e.g., a reactive ion etch (RIE) process in accordance with one embodiment, such that the select gates 221a, 221b of the first and second select structures 221a', 221b' are formed.

In accordance with an embodiment, the spacer select gates 221a, 221b may be formed by depositing a polysilicon layer (Poly3 deposition) over the sidewalls 202a, 202b and the top surface 202c of the charge storing memory cell layer stack 202, and anisotropically etching the polysilicon layer selectively to the electrically insulating layer 211 (e.g., SG oxide layer) by means of a reactive ion etch (RIE) process. In this way, drain word line (WL) spacers of the memory cell arrangement may be formed. In other words, spacers that are in each case arranged between a drain region and a wordline (WL) region of the memory cell arrangement may be formed by structuring the polysilicon layer, wherein the spacers may serve as select gates of the memory cell arrangement. In accordance with an embodiment, the polysilicon layer (poly3 layer) may also be deposited and anisotropically etched (e.g., using RIE) in one or more peripheral areas (not shown) of the memory cell arrangement, forming a structure similar to the one shown in FIG. 2C but with a single gate layer, i.e., with electrically conductive layer 206 and insulating layer 211 but without layer 204, and with spacer select gates 221a and 221b. In accordance with an embodiment, the peripheral areas may include one or more logic devices. In this case, the peripheral areas may also be referred to as logic areas.

FIG. 2D shows in a view 230 that a mask layer 231 is formed over the charge storing memory cell layer stack 202 and over the first and second select structures 221a', 221b', wherein the mask layer 231 is structured such that it has an opening (indicated by double arrow 232) above a portion 233 of the charge storing memory cell layer stack 202 in the center between the first select structure 221a' and the second select structure 221b'. In other words, the mask layer 231 may be formed such that a center portion 233 of the charge storing memory cell layer stack 202 (or of the electrically insulating layer 211 formed thereon) remains exposed. In accordance with an embodiment, the peripheral areas (not shown) may also remain exposed, i.e., not covered by the mask layer 231 (e.g., no resist block). In accordance with an embodiment, the mask layer 231 or mask may be configured as a cut mask (for example, as a block level cut mask such as an i-line mask (i.e. a mask for i-line photolithography) or a DUV 248-nm mask (i.e., a mask used in photolithography with deep ultraviolet radiation of 248 nm wavelength), e.g., as a mask to open a region for later removal by RIE). A block level cut mask may imply non-critical alignment since features considerably larger than 1.5 F will be printed on a wafer in this case. In accordance with another embodiment, the mask layer 231 may include or may be made of a suitable mask material such as, for example, a resist material (e.g., photoresist) or an oxide or nitride material (e.g., hardmask). In accordance with one embodiment, the mask layer 231 may be configured as a photoresist and may be structured by means of a suitable lithographical process (e.g., photolithography).

The mask layer 231 may serve to mask the first and second select structures 221a', 221b' and portions of the charge storing memory cell layer stack 202 during a removal of the exposed portion 233 of the charge storing memory cell layer stack 202, as will be described herein below in connection with FIG. 2E. Clearly, by removing the exposed portion 233 of the charge storing memory cell layer stack 202, an opening may be provided for a subsequent formation of a cell source of the memory cell arrangement. The mask layer or mask 231 may also be referred to as MS mask.

Figure 2E:
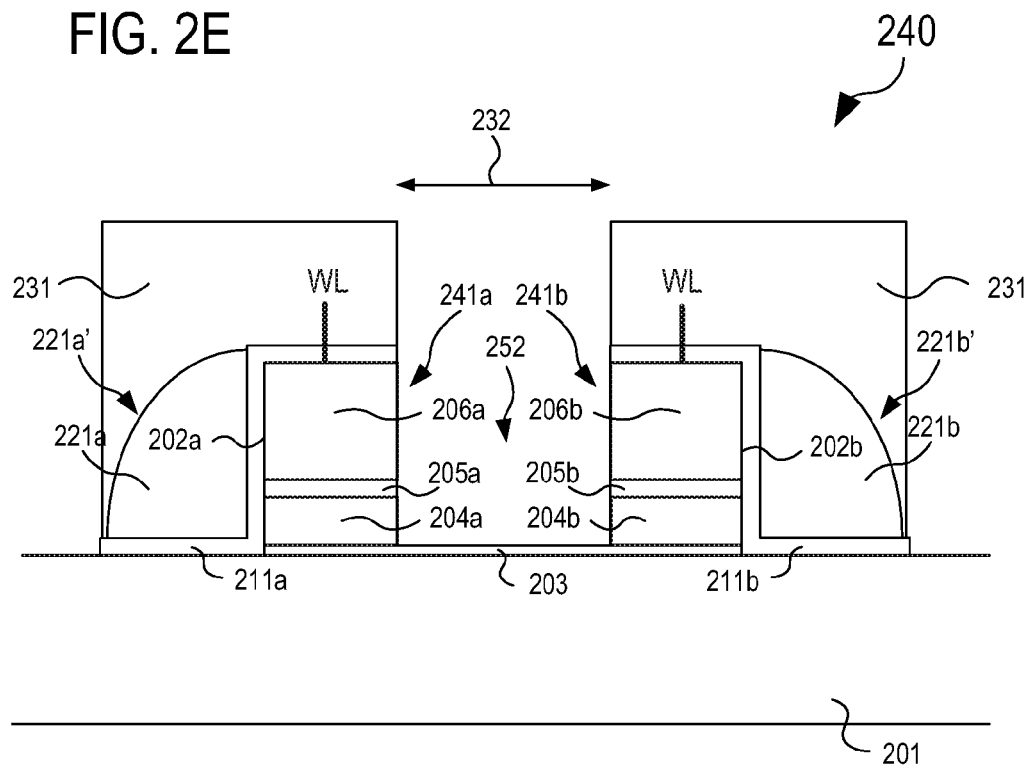

FIG. 2E shows in a view 240 that the portion 233 of the charge storing memory cell layer stack 202 between the first and second select structures 221a', 221b' is removed such that first and second charge storing memory cell structures 241a, 241b are formed. In accordance with an embodiment, the removal of the portion 233 of the charge storing memory cell layer stack 202 may include or may be achieved by means of anisotropically etching the portion 233 of the charge storing memory cell layer stack 202, for example, by means of a reactive ion etch (RIE) process in accordance with one embodiment. In case that the charge storing layer 204 and the electrically conductive layer 206 include or are made of polysilicon, the etching of the charge storing memory cell layer stack 202 by means of an RIE process may also be referred to as a stacked poly RIE. In accordance with an embodiment, the polysilicon spacers 221a and 221b in the logic peripheral areas (not shown) may be removed completely (or almost completely) by the etch process that is used to remove the portion 233 of the charge storing memory cell layer stack 202. In other words, the same etch process (e.g., RIE process) that is used for poly removal in the opening 232 in the cell areas may completely remove polysilicon spacers 221a, 221b of one or more structures in the peripheral areas.

In accordance with an embodiment, the etching of the charge storing memory cell layer stack 202 may stop on the first electrically insulating layer 203 (e.g., on the oxide layer) of the charge storing memory cell layer stack 202, as shown in FIG. 2E, for example according to an optional electrical bias scheme. In accordance with an alternative embodiment, the first electrically insulating layer 203 may also be etched such that the surface of the substrate 201 is exposed between the first and second charge storing memory cell structures 241a, 241b, for example when forming a self-aligned contact in the region between the first and second charge storing memory cell structures 241a, 241b.

Clearly, by means of removing a middle section of the charge storing memory cell layer stack 202, first and second charge storing memory cell structures 241a, 241b, separated by a gap 252, are formed, wherein the first charge storing memory cell structure 241a includes a first portion 204a of the charge storing layer 204, a first portion 205a of the second electrically insulating layer 205, and a first portion 206a of the electrically conductive layer 206 of the charge storing memory cell layer stack 202, and wherein the second charge storing memory cell structure 241b includes a second portion 204b of the charge storing layer 204, a second portion 205b of the second electrically insulating layer 205, and a second portion 206b of the electrically conductive layer 206 of the charge storing memory cell layer stack 202.

The first charge storing memory cell structure 241a is laterally disposed from the first select gate 221a of the first select structure 221a' and may be electrically insulated from the first select gate 221a by a first portion 211a of the electrically insulating layer 211, and the second charge storing memory cell structure 241b is laterally disposed from the second select gate 221b of the second select structure 221b' and may be electrically insulated from the second select gate 221b by a second portion 211b of the electrically insulating layer 211.

In accordance with an embodiment, the first portion 204a of the charge storing layer 204 may serve as a floating gate (FG) and the first portion 206a of the electrically conductive layer 206 may serve as a control gate or logic gate (LG) of a first memory cell of the memory cell arrangement, while the second portion 204b of the charge storing memory layer 204 and the second portion 206b of the electrically conductive layer 206 may serve as a floating gate and a control gate (logic gate), respectively, of a second memory cell of the memory cell arrangement. In addition, the first and second select gates 221a, 221b may serve as select gates of the first and second memory cells of the memory cell arrangement.

Figure 2F:
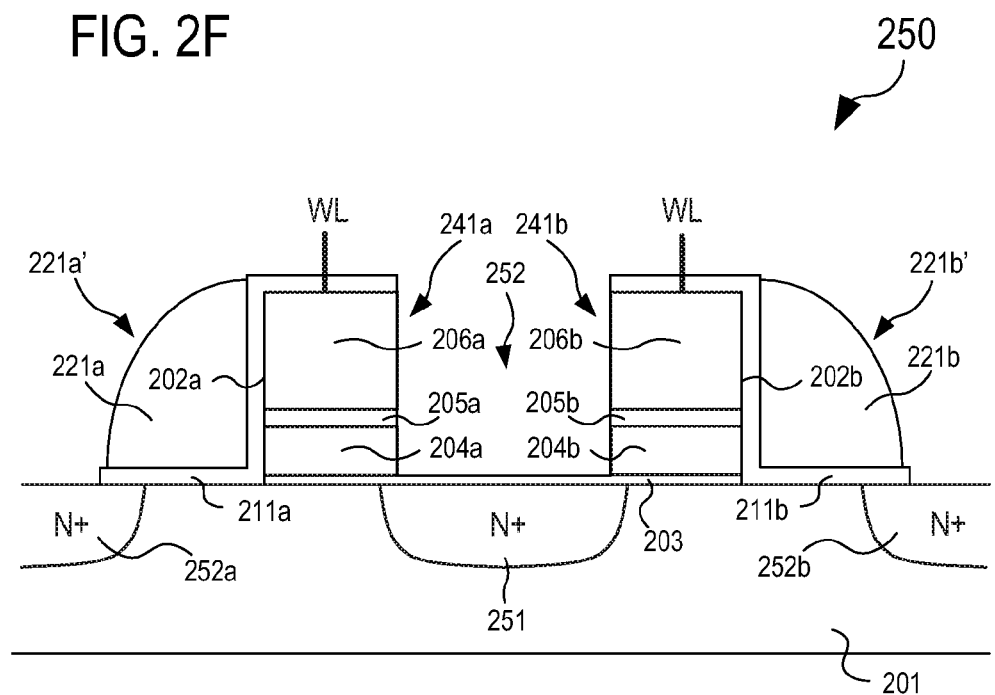

FIG. 2F shows in a view 250 that the material (e.g., resist) of the mask layer 231 is stripped (removed) after removal of the portion 233 of the charge storing memory cell layer stack 202. In accordance with an embodiment, a wet clean process may be carried out subsequently. For example, in accordance with an embodiment, a well-known plasma resist strip process may be applied to remove the resist, followed by a wet Piranha clean process to completely remove the resist. It is further shown in FIG. 2F that a doped source junction 251 and doped first and second drain junctions 252a, 252b of the memory cell arrangement are formed in the substrate 201. The source junction 251 is formed between the first and second charge storing memory cell structures 241a, 241b. The drain junctions 252a, 252b are formed next to the select gates 221a, 221b, wherein the select gates 221a, 221b may partially overlap the drain junctions 252a, 252b. In other words, a first drain junction 252a is formed next to the first select gate 221a and may be partially overlapped by the first select gate 221a, and a second drain junction 252b is formed next to the second select gate 221b and may be partially overlapped by the second select gate 221b.

In accordance with an embodiment, the source junction 251 and the first and second drain junctions 252a, 252b may be formed by means of implanting dopant atoms or implants into the substrate 201, e.g., suitable n-type dopant species such as, for example, arsenic or phosphorous, although other suitable dopant species may be used alternatively.

In accordance with an embodiment, a lithographical process using a mask (also referred to as MD mask) may be used to implant the memory cell (e.g., flash cell) source and drain junctions 251, 252a and 252b. Clearly, a lithographical process (also referred to as MD litho) may be applied to open or expose memory arrays (e.g., flash cells in accordance with an embodiment) of the memory cell arrangement while logic areas may be covered by the MD mask (e.g., MD resist block).

In accordance with one embodiment, the source junction 251 and the drain junctions 252a, 252b may be highly doped, for example, highly n-doped (e.g., n+ doped) by means of the implantation process.

In accordance with an embodiment, the implantation of the dopant atoms (also referred to as cell source and drain junction implants) may be carried out after formation of the first and second select structures 221a', 221b' and after formation of the first and second charge storing memory cell structures 241a, 241b.

In accordance with an embodiment, a mask that has been used in the structuring of the electrically conductive layer (e.g., polysilicon layer) for the select structures 221a', 221b' and for the charge storing memory cell structures 241a, 241b may be used as the MD mask during the implantation of the cell source and drain junction implants. In other words, in accordance with this embodiment, the same mask may be used in the context of the formation of the select structures 221a', 221b', 241a, 241b and in the context of the formation of the source and drain junctions 251, 252a, 252b.

In accordance with another embodiment, an ashing process and/or a wet clean process may be applied to remove possible residues of one or more resist layers (e.g., photoresist layers) that may have been used during the structuring/etching of the electrically conductive layer for the select structures and/or during the drain junction implantation.

Clearly, in accordance with an embodiment, a self-aligned source of the memory cell arrangement may be formed by means of the removal of the portion 233 of the charge storing memory cell layer stack 202 (using the mask 231, e.g., a block-level mask) and a subsequent source junction ion implantation.

In accordance with the embodiment shown in FIG. 2F, the source junction 251 and the first and second drain junctions 252a, 252b are both formed after the removal of the exposed portion 233 of the charge storing memory cell layer stack 202 (for example, using the same dopant implantation process). In accordance with an alternative embodiment (not shown), the first and second drain junctions 252a, 252b may be formed before removing the portion 233 of the charge storing memory cell layer stack 202.

Figure 2G:
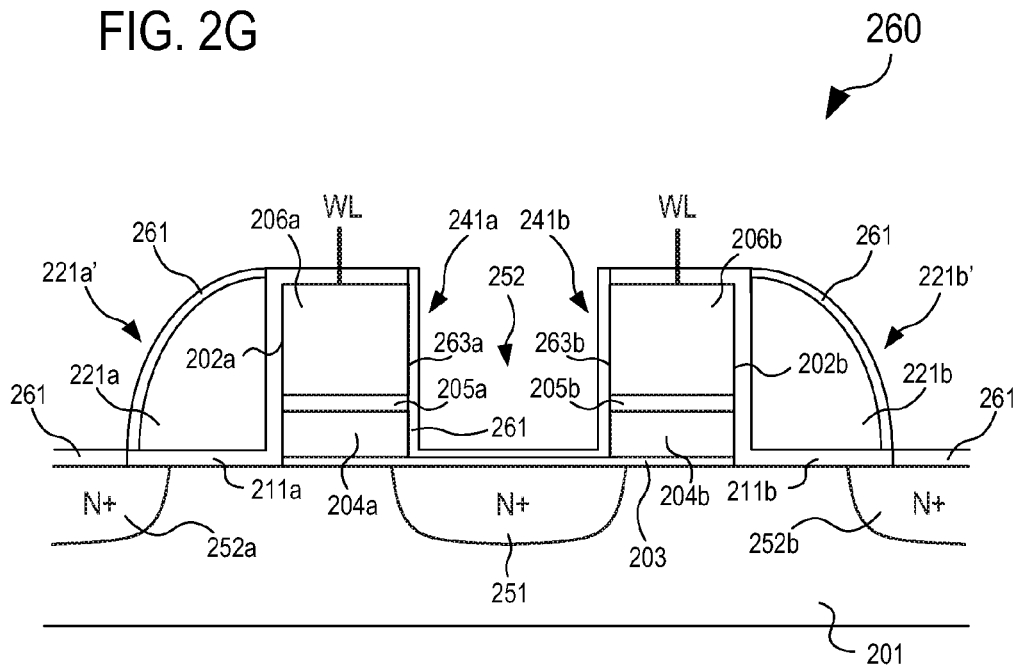

FIG. 2G shows in a view 260 that the mask layer 231 is removed after the formation of the source junction 251 and the drain junctions 252a, 252b. In accordance with an embodiment, the material (e.g. resist material) of the mask layer 231 may be removed by means of a stripping process. In accordance with another embodiment, a wet cleaning process may be carried out in addition to the stripping of the mask layer 231, for example, after the stripping process.

In accordance with another embodiment, an oxide layer 261 may be formed on the first and second select gates 221a, 221b of the first and second select structures 221a', 221b', on sidewalls 263a, 263b of the charge storing memory cell structures 241a, 241b and on an exposed portion of the first electrically insulating layer 203 in the gap 252 between the first and second charge storing memory cell structures 241a, 241b, and on the substrate 201 in regions adjacent to the first and second select structures 221a', 221b', as shown in FIG. 2G. In accordance with an embodiment, the oxide layer 261 may be formed by means of a thermal oxidation process. In accordance with another embodiment, the oxide layer 261 may have a thickness in the range from about 2 nm to about 50 nm, for example, about 8 nm in accordance with one embodiment.

In accordance with another embodiment, an oxide layer (not shown) may be formed on sidewalls of one or more logic gates (not shown) in peripheral areas of the memory cell arrangement. In this case, all sidewalls and exposed gate oxides associated with the memory array (e.g. oxide layer 261, sidewalls 263a, 263b of the charge storing memory cell structures 241a, 241b) may grow slightly since very little oxide may grow on top of oxide. Clearly, a logic sidewall oxidation (Logic SWOX) process may be carried out in accordance with an embodiment, thereby forming an oxide layer at least on sidewalls of the logic gates in the peripheral areas of the memory cell arrangement.

In accordance with an embodiment, industry standard logic and/or HV supporting devices (not shown) may subsequently be formed in the peripheral areas using, for example, one or more lightly doped drain (LDD) implantation process steps, one or more source/drain (S/D) ion implantation process steps and one or more silicidation process steps.

Figure 2H:
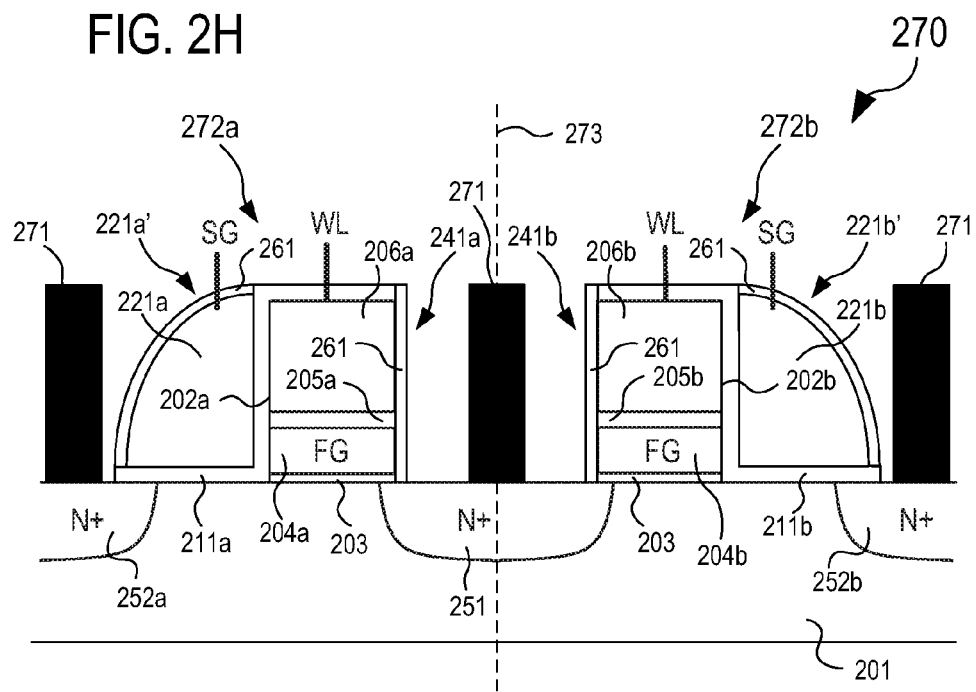

FIG. 2H shows in a view 270 that contacts 271 are formed on the first and second drain junctions 252a, 252b and on the source junction 251 to make electrical contact to the junctions. In accordance with an embodiment, the first electrically insulating layer 203 and the oxide layer 261 formed thereon in the region between the first and second charge storing memory cell structures 241a, 241b may be removed before forming the contact 271 on the source junction 251, as shown in FIG. 2H.

Figure 2J:
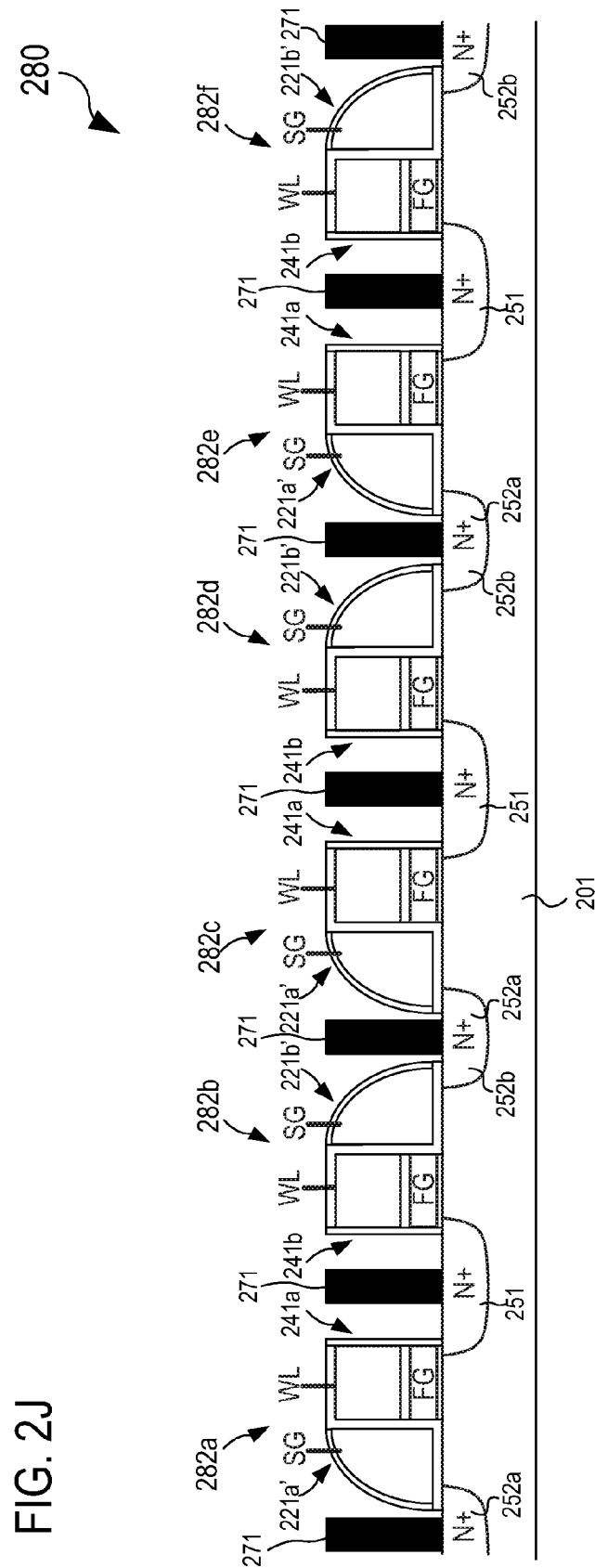
FIG. 2J shows a memory cell arrangement in accordance with an embodiment.

FIG. 2H clearly shows a memory cell arrangement including a first memory cell 272a and a second memory cell 272b in a mirror-symmetrical arrangement (clearly, mirror-symmetrical to line 273 in FIG. 2H), wherein the two memory cells 272a, 272b share a common source junction 251. The source junction 251 may be configured as a self-aligned source, as described above, having a standard contact to gate stack border spacing. Each of the memory cells 272a, 272b may be configured as a floating gate memory cell including a floating gate (FG) as charge storing layer (as shown in FIG. 2H), alternatively as a charge trapping memory cell. In addition to the memory cells 272a, 272b shown in FIG. 2H, the memory cell arrangement may include further memory cells arranged adjacent to the memory cells 272a, 272b. In this case, the contacts 271 formed on the first and second drain junctions 252a, 252b may in each case be shared by two adjacent memory cells as is shown in FIG. 2J, which shows a memory cell arrangement 280 including six memory cells 282a, 282b, 282c, 282d, 282e and 282f. As can be seen from FIG. 2J, a contact 271 is in each case arranged between the select structure 221b' of one memory cell (e.g., memory cell 282b) and the select structure 221a' of an adjacent memory cell (e.g., memory cell 282c) and is shared by the drain junctions 252b, 252a of these two cells. In accordance with another embodiment, the memory cells of a memory cell arrangement may be arranged in rows and columns such that clearly a memory array may be provided. In accordance with another embodiment, source and drain junctions in the memory cell arrangement may be reversed. In other words, region 251 may be configured as a drain junction and regions 252a, 252b may be configured as source junctions of the memory cell arrangement.

The memory cell arrangement shown in FIG. 2H may be further processed in accordance with one or more industry known logic copper (process of record (POR)) back-end-of-line (BEOL) processing steps.

Figure 3B:
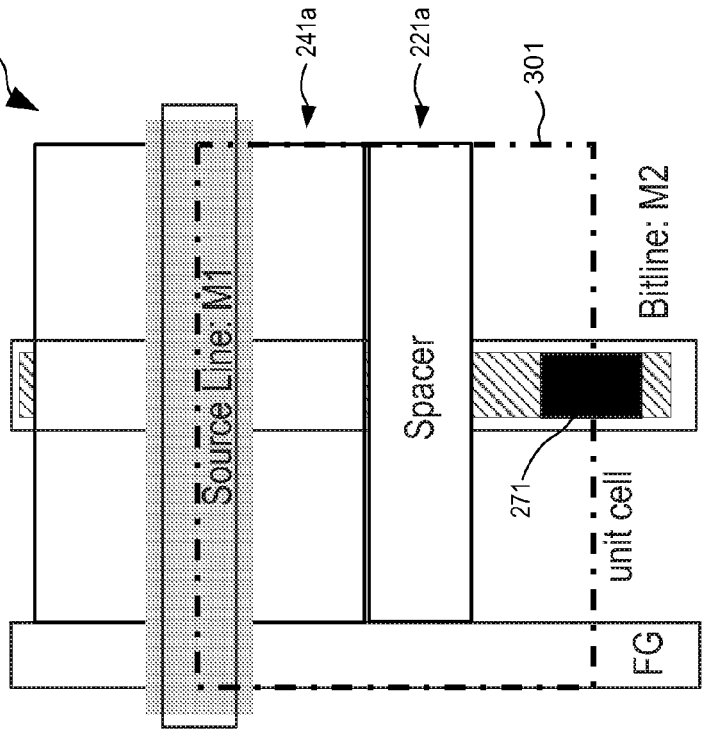
FIGS. 3A and 3B show a cross-sectional view and a layout view of a memory cell arrangement manufactured in accordance with the method illustrated in FIGS. 2A to 2H.
Figure 3A:
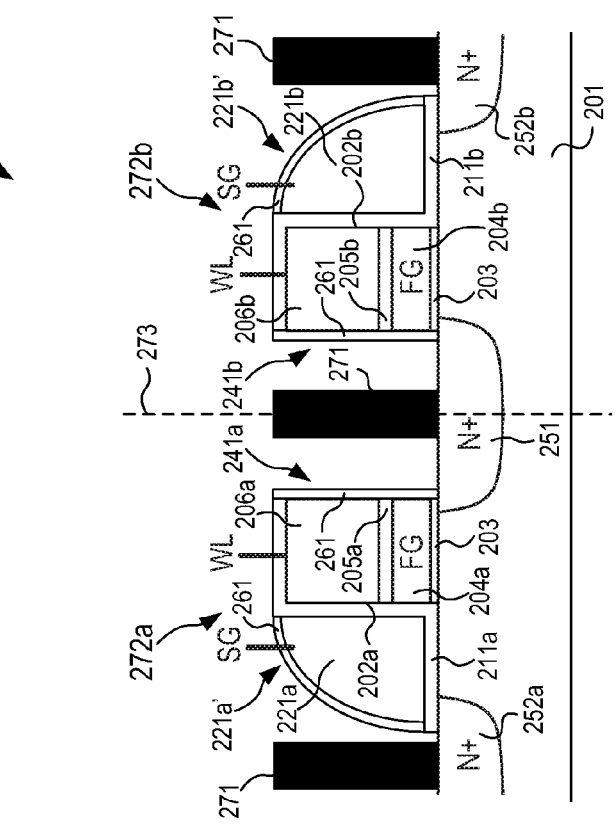

FIG. 3A and FIG. 3B show a cross-sectional view and a layout view, respectively, of a memory cell arrangement 300 that may be manufactured in accordance with the embodiment described in connection with FIGS. 2A to 2H with borderless contact (e.g., no border spacing between contact to gate stack) for further cell scaling. The cross-sectional view shown in FIG. 3A is similar to the view 270 shown in FIG. 2H. In the layout view of FIG. 3B, a unit cell 301 of the memory cell arrangement 300 is shown, which includes one memory cell (clearly, the memory cell 272a shown in FIG. 3A) of the memory cell arrangement 300.

The values for the pitches and the cell area may depend, for example, on the process technology used (e.g., technology node). As shown in the layout of FIG. 3B, a control line (referred to as source line in the layout) connecting to the cell may be located in the Metal1 (M1) metallization level, and a bitline connecting to the cell may be located in the Metal2 (M2) metallization level.

In the following, certain features and potential effects of embodiments described herein above in connection with FIGS. 2A to 2H will be described.

In accordance with an embodiment, a method for manufacturing a memory cell arrangement with a self-aligned (SA) source is provided.

In accordance with an embodiment, a next-generation (1+) litho ahead "Poly Spacer" PS mask may be replaced by a block level cut mask MS.

In accordance with another embodiment, a self-aligned source and junction of the memory cell arrangement may be obtained together.

In accordance with some embodiments, a memory cell arrangement may be manufactured with less processing costs and/or overlay.

In accordance with another embodiment, a single mask (MD mask) may be used for forming both drain-wordline spacers and junctions of a memory cell arrangement.

In accordance with another embodiment, a removal of a source poly spacer may not be needed. Thus, UPD (unit process development) time and costs may, for example, be reduced. Furthermore, risks that are related to a source poly spacer removal (e.g., remaining poly-stringers) may be reduced or avoided.

In the following, a method for manufacturing a memory cell arrangement in accordance with another embodiment will be described in connection with FIGS. 4A to 4F.

Figure 4A:
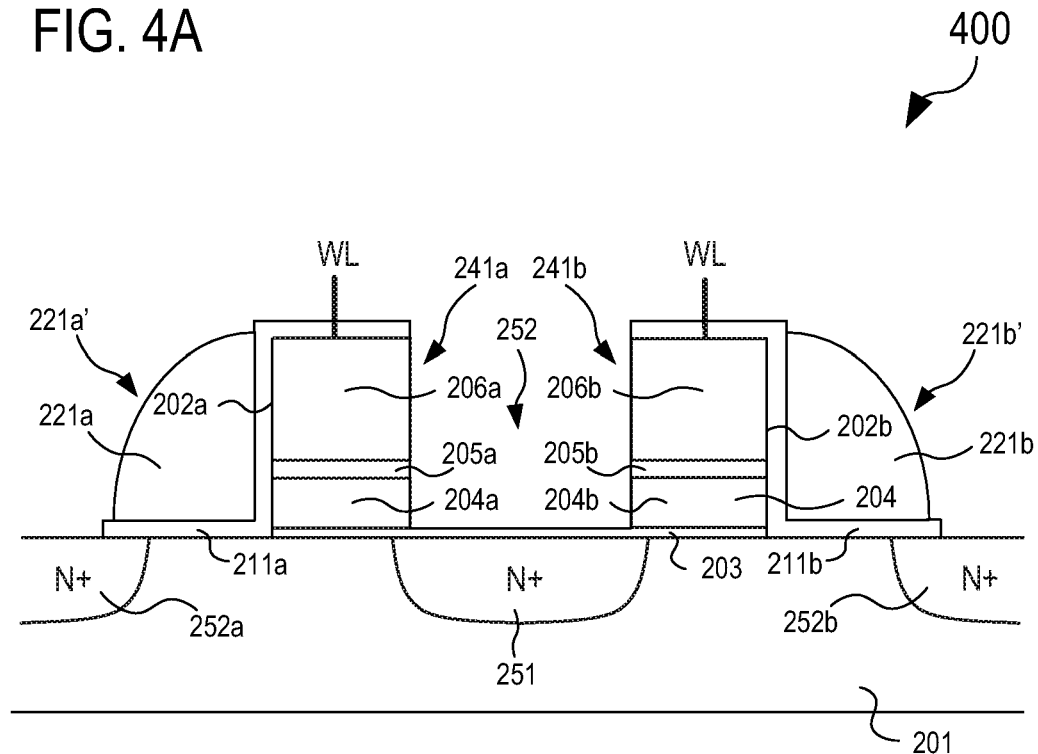
FIGS. 4A to 4F show different views for illustrating a method for manufacturing a memory cell arrangement in accordance with another embodiment.

FIG. 4A shows in a view 400 a structure that is similar to the structure shown in FIG. 2F. The structure of FIG. 4A may be obtained in a similar manner as described herein above in connection with FIGS. 2A to 2F.

Figure 4B:
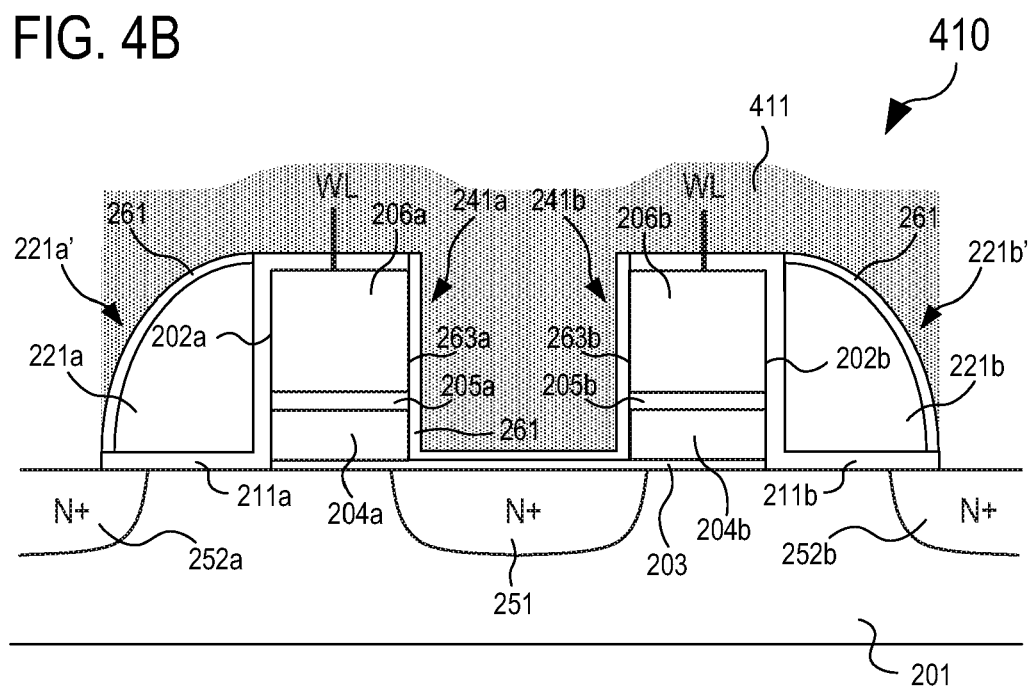

FIG. 4B shows in a view 410 that an oxide layer 261 is formed on the first and second select gates 221a, 221b. The oxide layer 261 may be formed in a similar manner as described herein above in connection with FIG. 2G, for example, by means of thermal oxidation in accordance with an embodiment, and may have, for example, a thickness in the range from about 2 nm to about 50 nm, e.g. about 8 nm in accordance with one embodiment. In accordance with an embodiment, the oxide layer 261 may also be formed on top of the charge storing memory cell structures 241a, 241b, and on sidewalls 263a, 263b of the charge storing memory cell structures 241a, 241b that are distant from the select structures 221a', 221b', as shown in FIG. 4B. In accordance with another embodiment, the oxide layer 261 may also be formed on top of and on sidewalls of one or more logic gates in peripheral areas (not shown) of the memory cell arrangement.

FIG. 4B further shows that an oxide layer 411 is formed over the first and second select structures 221a', 221b', and over and between the first and second charge storing memory cell structures 241a, 241b. As shown, the oxide layer 411 may be formed on the oxide layer 261 that is formed on the first and second select gates 221a, 221b of the first and second select structures 221a', 221b' and on the sidewalls 263a, 263b that are distant from the select structures 241a, 241b and on the first electrically insulating layer 203 in the region between the first and second charge storing memory cell structures 241a, 241b. Furthermore, the oxide layer 411 may be formed on portions of the first and second portions 211a, 211b of the electrically insulating layer 211 that are formed on the first and second charge storing memory cell structures 241a, 241b, as shown in FIG. 4B as well as on top of a logic gate in the peripheral areas (not shown).

As shown in FIG. 4B, the oxide layer 411 may clearly be formed such that it fills the gap 252 between the first and second charge storing memory cell structures 241a, 241b.

In accordance with an embodiment, the oxide layer 411 may be formed by means of a deposition process, for example a TEOS (tetra ethylene ortho silicate) deposition process, e.g., an ozone-activated $O_3$TEOS deposition process in accordance with one embodiment.

Figure 4C:
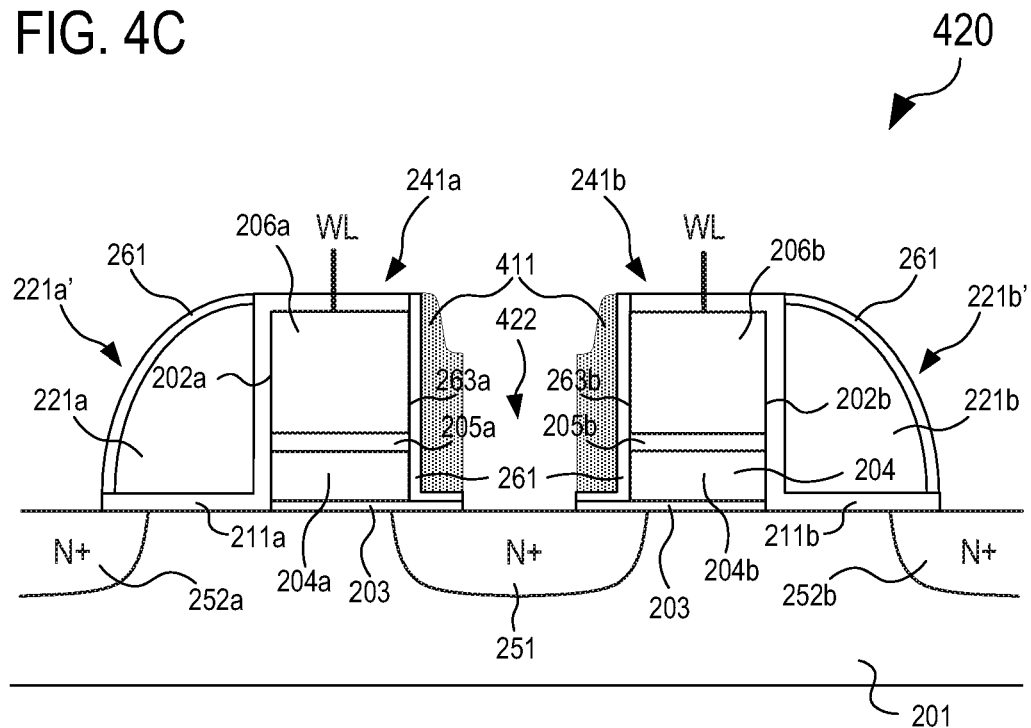

FIG. 4C shows in a view 420 that the oxide layer 411 is removed from above the first and second select structures 221a', 221b' and the first and second charge storing memory cell structures 241a, 241b. Furthermore, a portion of the oxide layer 411 between the first and second charge storing memory cell structures 241a, 241b is removed such that portions of the oxide layer 411 remain over the sidewalls 263a, 263b of the charge storing memory cell structures 241a, 241b and a gap 422 is formed between the first and second charge storing memory cell structures 241a, 241b. Furthermore, a portion of the oxide layer 411 in the logic peripherals may be removed such that portions of the oxide layer 411 remain over the sidewalls of the logic gate structures (not shown), in accordance with an embodiment.

In accordance with an embodiment, the removal of the oxide layer 411 may include or may be achieved by means of an anisotropic etch process such as, for example, a reactive ion etch (RIE) process. In accordance with one embodiment, the RIE process may be selective to the material (e.g., silicon) of the substrate 201. In accordance with another embodiment, the RIE process may be carried out such that the etching is stopped after a predetermined time interval.

In accordance with one embodiment, the removal of the oxide layer 411 (e.g., the anisotropic etching) may be carried out in such a manner that portions of the oxide layer 261 and of the first electrically insulating layer 203 located below the oxide layer 411 may also be removed. In other words, any source insulating layer(s) (e.g., source oxide) arranged over the source junction 251 may be removed such that the source junction 251 is exposed, as shown in FIG. 4C. In this case, an electrically conductive layer (e.g., a polysilicon layer) that may be deposited subsequently may be electrically connected to the source junction 251 as will be described herein below in connection with FIG. 4D. In accordance with an alternative embodiment, the removal of the oxide layer 411 may be carried out in such a manner that the source insulating layer(s) (e.g., source oxide) is/are only partially removed, for example thinned to a thickness in the range from about 2 nm to about 50 nm, e.g., to a thickness of about 6 nm in accordance with one embodiment.

Figure 4D:
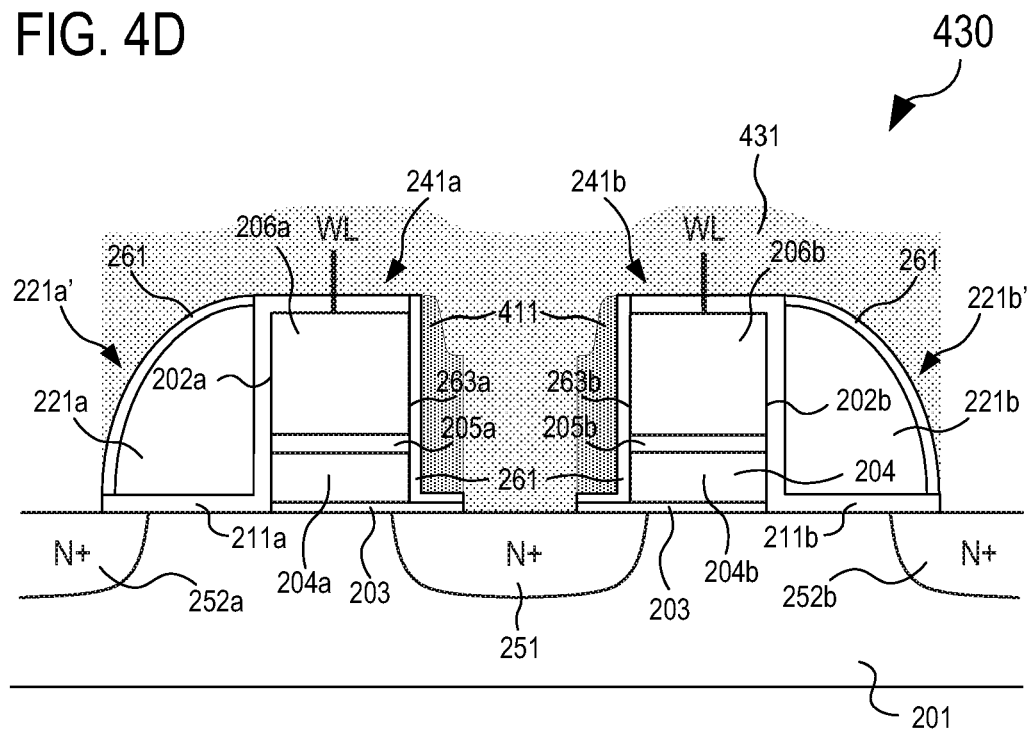

FIG. 4D shows in a view 430 that an electrically conductive layer 431 is formed over the first and second select structures 221a', 221b', and over and between the first and second charge storing memory cell structures 241a, 241b. Furthermore, the electrically conductive layer 431 may also be formed over the logic peripherals (not shown). The electrically conductive layer 431 may, for example, be formed by depositing an electrically conductive material. The electrically conductive material may clearly fill the gap 422 between the first and second charge storing memory cell structures 241a, 241b.

In accordance with an embodiment, the electrically conductive material of the electrically conductive layer 431 may be polysilicon. In other words, a polysilicon layer may be formed in accordance with one embodiment. In accordance with an embodiment, the polysilicon layer may be formed by means of a deposition process (Poly4 deposition). In accordance with an embodiment, the polysilicon layer (poly4 layer) may also be deposited in peripheral areas (not shown) of the memory cell arrangement.

Figure 4E:
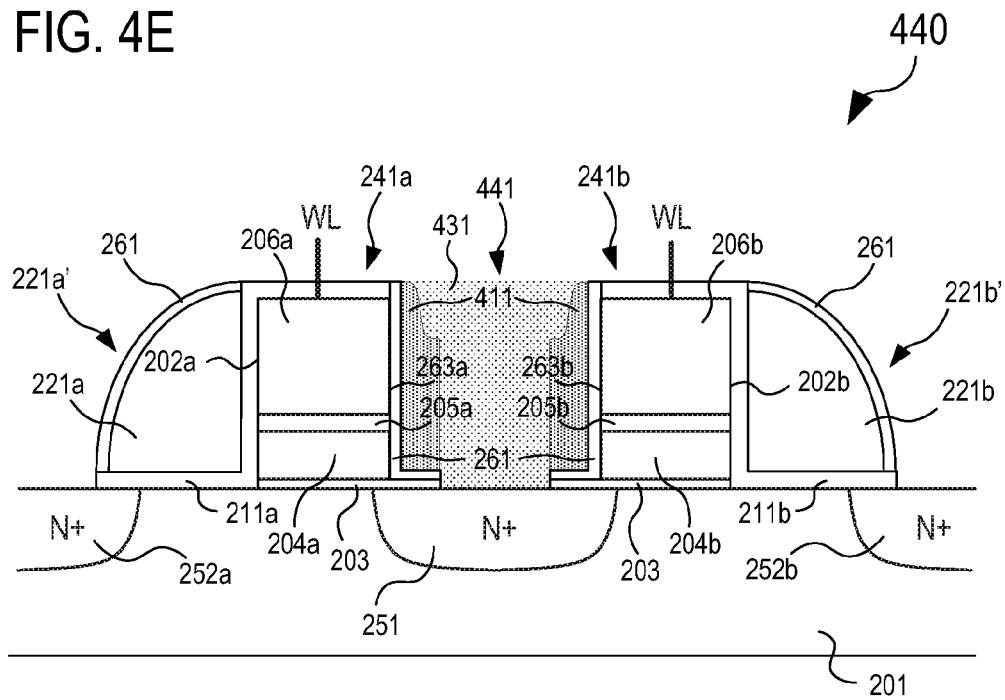

The electrically conductive layer 431 may serve to form a source plug 441 (e.g., a source fill-in hole with a polysilicon layer in place of a contact plug as shown, for example, in FIG. 3A) of the memory cell arrangement (cf. FIG. 4E).

In case that any insulating layer(s) (e.g., source oxide) arranged on or above the source junction 251 has/have been removed, the electrically conductive layer 431 may be electrically connected to the source junction 251 in accordance with an embodiment, as shown in FIG. 4D. In this case, there may be an electrical short from the source plug (e.g., poly plug) to the source of the memory cell arrangement. This may, for example, be used in case of a flash memory cell arrangement that uses a Fowler-Nordheim (FN) erase mechanism, in which memory cells are erased by FN tunneling of charge carriers (e.g., electrons) from the floating gate (FG) through the tunnel dielectric layer 203 to the channel of a memory cell.

In accordance with an alternative embodiment, the electrically conductive layer 431 may be electrically insulated from the source junction 251 by means of one or more thin insulating layers (e.g., the first electrically insulating layer 203 and/or the oxide layer 261). This may, for example, be used in case of a flash memory cell arrangement that uses an erase mechanism, in which memory cells are erased by tunneling of charge carriers from the floating gate to the conducting source plug 441.

FIG. 4E shows in a view 440 that the electrically conductive material of the electrically conductive layer 431 is removed from above the first and second select structures 221a', 221b' and the first and second charge storing memory cell structures 241a, 241b. Thus, a source plug 441 may be formed that may be electrically connected to the source junction 251 and electrically insulated from the first and second charge storing memory cell structures 241a, 241b by the oxide layers 411 and 261. In accordance with an embodiment, the removal of the electrically conductive material of the electrically conductive layer 431 may include or may be achieved by means of an anisotropic etch process such as, for example, a reactive ion etch (RIE) process.

Clearly, in accordance with an embodiment, a source plug 441 (e.g. source poly plug) may be formed by means of depositing an electrically conductive layer 431 and subsequent back-etching of the layer 431. Thus, a self-aligned borderless source (poly plug) may be achieved in the memory cell arrangement.

In accordance with another embodiment, a logic gate (LG) lithographical process may be applied to open the logic gates in peripheral areas (not shown) of the memory cell arrangement while the memory cells of the memory cell arrangement are blocked (e.g., by resist), as described herein above. In accordance with an embodiment, a structured mask layer (e.g., resist) may be used in the context of the lithographical process. Furthermore, an anisotropic etch process, e.g., a reactive ion etch (RIE) process, may be carried out to remove portions of the poly4 layer 431 previously deposited in the peripheral areas (not shown) of the memory cell arrangement, as described herein above in connection with FIG. 4D. In accordance with an embodiment, the etch process may stop on the electrically insulating layer 261. In accordance with another embodiment, an ashing process and a wet clean process may be applied after the etch process. Furthermore, in accordance with another embodiment, a logic sidewall oxidation process may be carried out for the logic devices in the peripheral areas (not shown).

In accordance with an embodiment, industry standard logic and/or HV supporting devices (not shown) may subsequently be formed in the peripheral areas using, for example, one or more lightly doped drain (LDD) implantation process steps, one or more source/drain (S/D) ion implantation process steps and one or more silicidation process steps.

Figure 4F:
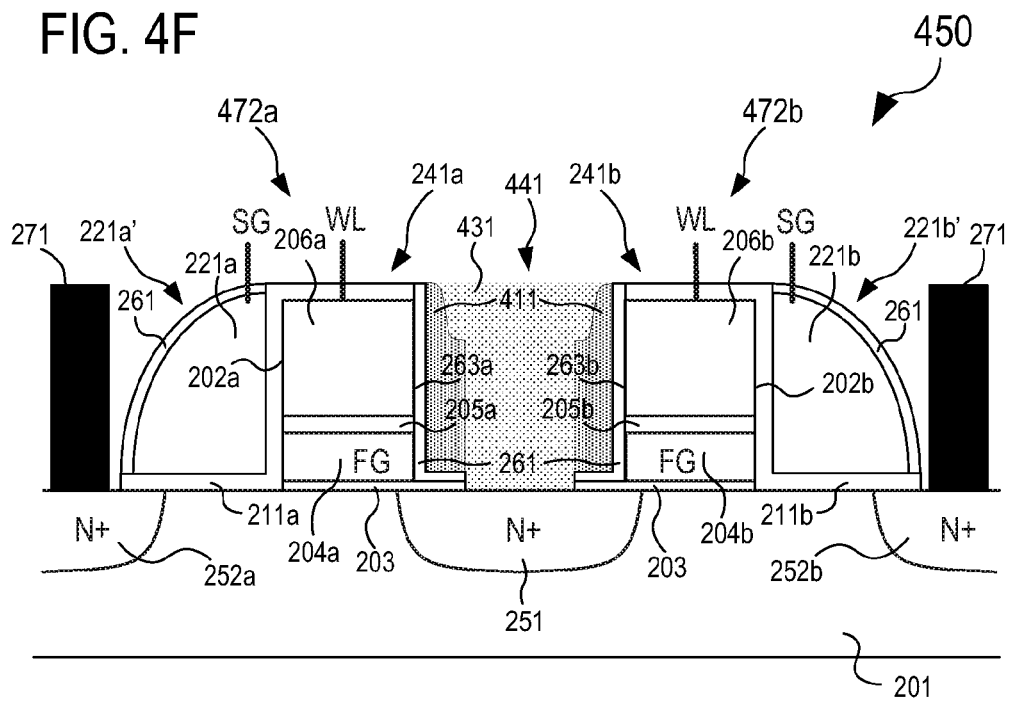
Figure 5:
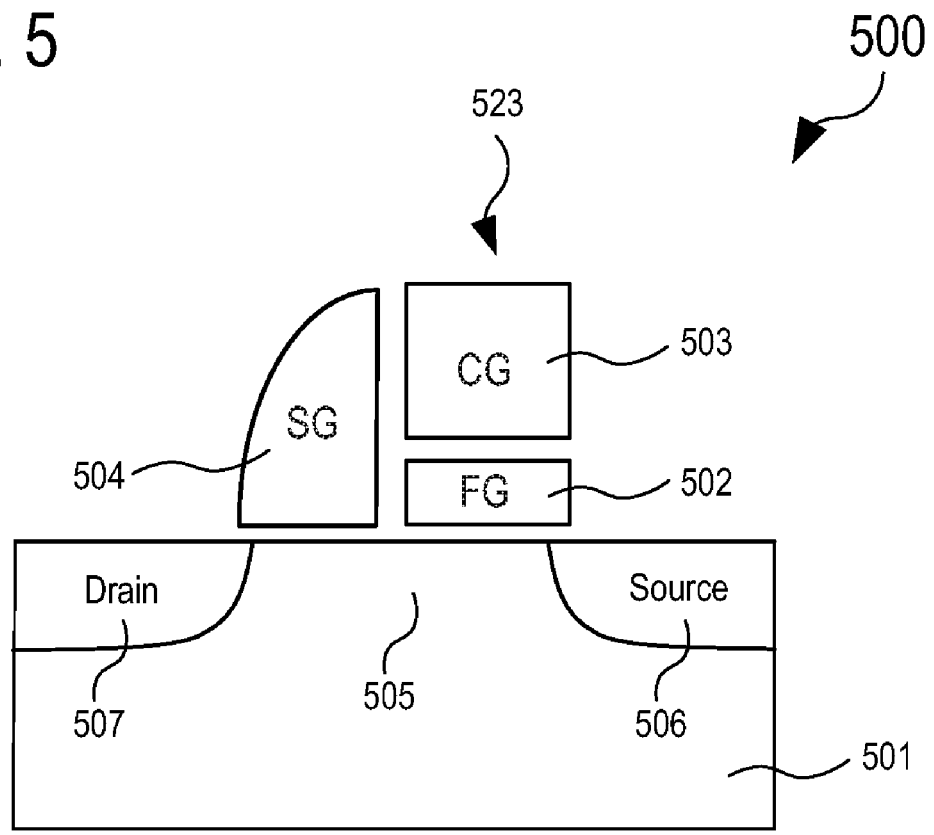
FIG. 5 shows a flash memory cell.

FIG. 4F shows in a view 450 that contacts 271 are formed on the first and second drain junctions 252a, 252b of the memory cell arrangement to make electrical contact to the drain junctions 252a, 252b. The contacts 271 may be configured in a similar manner as described herein above in connection with FIG. 2H, and may be shared by adjacent memory cells of the memory cell arrangement in a similar manner as in the memory cell arrangement 280 shown in FIG. 2J.

FIG. 4F clearly shows a memory cell arrangement including first and second memory cells 472a, 472b in a mirror-symmetrical arrangement, wherein the two memory cells 472a, 472b share a common source junction 251. Each of the memory cells 472a, 472b may be configured as a floating gate memory cell including a floating gate (FG) as charge storing layer (as shown in FIG. 4F), alternatively as a charge trapping memory cell.

The memory cell arrangement shown in FIG. 4F has a self-aligned source, which is configured as a borderless source. One effect of the borderless source may be that the memory cell arrangement may have a smaller y-pitch than the memory cell arrangement 300 shown in FIGS. 3A and 3B, since the space between the source contact and the logic gate (also referred to as SR-CA to PC space) may be saved two times in the memory cell arrangement of FIG. 4F.

Therefore, the unit cell area in the memory cell arrangement of FIG. 4F may be smaller than the unit cell area of the memory cell arrangement 300 shown in FIGS. 3A and 3B.

In accordance with another embodiment, the memory cell arrangement shown in FIG. 4F may be further processed in accordance with one or more known back-end-of-line (BEOL) processing steps.

In accordance with another embodiment, source and drain junctions in the memory cell arrangement shown in FIG. 4F may be reversed. In other words, region 251 may be configured as a drain junction and regions 252a, 252b may be configured as source junctions of the memory cell arrangement.

In the following, certain features and potential effects of embodiments described herein above in connection with FIGS. 4A to 4F will be described.

In accordance with an embodiment, a memory cell arrangement with a self-aligned source is provided, wherein the source may be configured as a borderless source.

In accordance with an embodiment, one additional block level mask may be used in the context of forming the borderless source of the memory cell arrangement. The additional block level mask may be used to remove material of the electrically conductive layer 431, for example to remove poly4 of the layer 431 in case that the layer 431 is configured as a poly4 layer.

In accordance with another embodiment, one additional polysilicon deposition (Poly4 deposition) may be used in the context of forming the borderless source.

In the following, certain features and potential effects of illustrative embodiments are described.

In accordance with an embodiment, a sidewall spacer split-gate may be formed using a block level mask and a self-aligned scheme instead of using a next generation litho mask PS. In other words, the next generation litho mask PS may be replaced by a block level mask. Thus, processing costs may be reduced, for example.

In accordance with an embodiment, drain gate spacers may be formed for two adjacent memory cells (the cells being mirrored by 180° with respect to one another), wherein a hi NA litho PS mask (i.e., a poly spacer lithography mask that implies an alignment with tight overlay spec or tight CD (critical dimension) and thus may require a lithography tool with high or very high numerical aperture (NA), which increases the manufacturing costs) is replaced by a block level cut mask to separate the cells. Thus, a removal of a source side gate spacer may be avoided (in other words, may not be needed), and a self-aligned source may be achieved.

In accordance with an embodiment, a self-aligned HS3P ("Hot Source Triple Poly") cell may be provided at low cost (since, for example, no hi NA litho mask is used or needed) and with reduced risk or even risk-free (since, for example, the development of a new gate spacer removal process is not needed, and thus the risk of poly-stringers may be reduced or avoided).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a memory cell arrangement, comprising:
    forming a charge storing memory cell layer stack over a substrate;
    forming first and second select structures over, respectively, first and second sidewalls of the charge storing memory cell layer stack, wherein the first and second select structures in each case comprise a select gate configured as a spacer and laterally disposed from the respective sidewall of the charge storing memory cell layer stack; and
    removing a portion of the charge storing memory cell layer stack between the first and second select structures after formation of the first and second select structures, thereby forming first and second charge storing memory cell structures.

2. The method of claim 1, wherein forming the charge storing memory cell layer stack comprises:
    forming a first electrically insulating layer over the substrate;
    forming a charge storing layer over the first electrically insulating layer;
    forming a second insulating layer over the charge storing layer;
    forming a control gate layer over the second insulating layer.

3. The method of claim 2, wherein the charge storing layer is configured as a floating gate layer or as a charge trapping layer.

4. The method of claim 1, wherein forming the first and second select structures comprises:
    forming an electrically conductive layer over the first and second sidewalls and over a top surface of the charge storing memory cell layer stack;
    removing a portion of the electrically conductive layer from above the charge storing memory cell layer stack such that the select gates of the first and second select structures are formed.

5. The method of claim 4, wherein forming the electrically conductive layer comprises depositing a polysilicon layer over the first and second sidewalls and over the top surface of the charge storing memory cell layer stack.

6. The method of claim 4, wherein removing the portion of the electrically conductive layer from above the charge storing memory cell layer stack comprises anisotropically etching the electrically conductive layer.

7. The method of claim 6, wherein the anisotropic etching of the electrically conductive layer comprises a reactive ion etch process.

8. The method of claim 1, further comprising:
    implanting dopant atoms into the substrate after formation of the first and second select structures and after removing the portion of the charge storing memory cell layer stack, thereby forming source/drain junctions of the memory cell arrangement in the substrate.

9. The method of claim 1, wherein removing the portion of the charge storing memory cell layer stack comprises:
    forming a mask layer over the charge storing memory cell layer stack and the first and second select structures, wherein the mask layer is structured such that it comprises an opening above the portion of the charge storing memory cell layer stack between the first and second select structures;
    anisotropically etching the portion of the charge storing memory cell layer stack.

10. The method of claim 9, wherein the mask layer is configured as a block level mask.

11. The method of claim 9, wherein the anisotropic etching of the portion of the charge storing memory cell layer stack comprises a reactive ion etch process.

12. The method of claim 9, wherein the charge storing memory cell layer stack comprises an electrically insulating layer arranged on the substrate, and wherein the anisotropic etching of the portion of the charge storing memory cell layer stack is carried out in such a manner that the etching stops on the electrically insulating layer of the charge storing memory cell layer stack.

13. The method of claim 1, further comprising:
    implanting dopant atoms into the substrate after formation of the first and second select structures and before removing the portion of the charge storing memory cell layer stack, thereby forming first and second source/drain junctions of the memory cell arrangement in the substrate.

14. The method of claim 13, further comprising:
    implanting dopant atoms into the substrate between the first and second charge storing memory cell structures after removing the portion of the charge storing memory cell layer stack, thereby forming a third source/drain junction of the memory cell arrangement.

15. The method of claim 1, further comprising:
    forming an electrically insulating layer at least on the first and second sidewalls of the charge storing memory cell layer stack before forming the first and second select structures, wherein the select gates of the first and second select structures are formed on the electrically insulating layer.

16. The method of claim 1, further comprising:
    forming an oxide layer over sidewalls of the first and second charge storing memory cell structures that are distant from the select structures, after removing the portion of the charge storing memory cell layer stack;
    and forming an electrically conductive layer over the oxide layer between the first and second charge storing memory cell structures.

17. The method of claim 16, wherein forming the oxide layer over the sidewalls of the first and second charge storing memory cell structures comprises:
    depositing the oxide layer over the first and second select structures, and over and between the first and second charge storing memory cell structures;

removing the oxide layer from above the first and second select structures and the first and second charge storing memory cell structures, and removing a portion of the oxide layer between the first and second charge storing memory cell structures.

18. The method of claim 17, wherein depositing the oxide layer comprises an ozone-activated TEOS deposition process.

19. The method of claim 17, wherein removing the portion of the oxide layer comprises anisotropically etching the oxide layer.

20. The method of claim 19, wherein the anisotropic etching of the oxide layer comprises a reactive ion etch process.

21. The method of claim 16, wherein forming the electrically conductive layer over the oxide layer between the first and second charge storing memory cell structures comprises:

depositing an electrically conductive material over the first and second select structures, and over and between the first and second charge storing memory cell structures;

removing the electrically conductive material from above the first and second select structures and the first and second charge storing memory cell structures.

22. The method of claim 16, wherein the electrically conductive layer comprises polysilicon.

23. A method for manufacturing a memory cell arrangement, comprising:

forming a charge storing memory cell layer stack over a substrate;

forming first and second select structures over, respectively, first and second sidewalls of the charge storing memory cell layer stack, wherein the first and second select structures in each case comprise a select gate configured as a spacer and laterally disposed from the respective sidewall of the charge storing memory cell layer stack;

removing a portion of the charge storing memory cell layer stack between the first and second select structures after formation of the first and second select structures, thereby forming first and second charge storing memory cell structures;

forming an oxide layer over sidewalls of the first and second charge storing memory cell structures that are distant from the select structures, after removing the portion of the charge storing memory cell layer stack; and forming an electrically conductive layer over the oxide layer between the first and second charge storing memory cell structures.

24. The method of claim 23, wherein forming the oxide layer over the sidewalls of the first and second charge storing memory cell structures comprises:

depositing the oxide layer over the first and second select structures, and over and between the first and second charge storing memory cell structures;

removing the oxide layer from above the first and second select structures and the first and second charge storing memory cell structures, and removing a portion of the oxide layer between the first and second charge storing memory cell structures.

25. The method of claim 23, wherein forming the electrically conductive layer over the oxide layer between the first and second charge storing memory cell structures comprises:

depositing an electrically conductive material over the first and second select structures, and over and between the first and second charge storing memory cell structures;

removing the electrically conductive material from above the first and second select structures and the first and second charge storing memory cell structures.

* * * * *